United States Patent [19]
Narula et al.

[11] Patent Number: 5,417,823
[45] Date of Patent: May 23, 1995

[54] METAL-NITRIDES PREPARED BY PHOTOLYTIC/PYROLYTIC DECOMPOSITION OF METAL-AMIDES

[75] Inventors: Chaitanya K. Narula, Ann Arbor; Michel M. Maricq, Grosse Ile, both of Mich.

[73] Assignee: Ford Motor Company, Dearborn, Mich.

[21] Appl. No.: 168,341

[22] Filed: Dec. 17, 1993

[51] Int. Cl.$^6$ .............................................. C01B 21/00
[52] U.S. Cl. ......................... 204/157.40; 204/157.41; 204/157.46; 427/553; 427/554; 427/556; 501/102; 501/96
[58] Field of Search ........... 204/157.4, 157.41, 157.46; 427/553, 554, 556; 501/102, 96

[56] References Cited

U.S. PATENT DOCUMENTS

| | | | |
|---|---|---|---|
| 4,395,436 | 7/1983 | Bianchi et al. | 427/53.1 |
| 4,636,403 | 1/1987 | Fisanick et al. | 427/53.1 |
| 4,916,115 | 4/1990 | Mantese et al. | 505/1 |
| 4,925,830 | 5/1990 | Walsh | 505/1 |
| 4,952,556 | 8/1990 | Mantese et al. | 505/1 |
| 5,100,693 | 3/1992 | Eisch et al. | 427/54.1 |
| 5,183,684 | 2/1993 | Carpenter | 427/574 |

OTHER PUBLICATIONS

Narula et al., "Laser Induced Decomposition of Precursor Containing M-N Bonds For the Prepn. of Metal Nitride Preceramics, Powders, and Coatings", Am. Chem. Soc. Pol. 1 Div. 32, 499 (1991).
Narula et al., "Prepn. of Composite Particles By Pulsed Nd-YAG Laser . . . " J. Am. Ceram. Soc. XX[XX].
"1.064 μm Multiphoton Laser-Induced Fluorescence and Dissociation . . . " Chemical Physics Letters; vol. 187 #3—Dec. 6, 1991.
"Laser Induced Decomposition of Precursors Containing M-N . . . ", Narula & Maricq. Am. Chem. Soc. Pol. Div. 32, 449 (1991).
"Preparation of Composite Particles by Pulsed Nd-YAG . . . " Journal Am. Ceram. Soc. vol. XX[XX] No. XX.
"Laser-Assisted Deposition of Thin Films from Gas--Phase and Surface-Adsorbed Molecules", Herman, Chem. Rev. 1989, 89, 1323-1357.

*Primary Examiner*—T. Tung
*Assistant Examiner*—C. Delacroix-Muirheid
*Attorney, Agent, or Firm*—Lorraine S. Melotik; Roger L. May

[57] ABSTRACT

This invention is directed to a method for preparing materials comprising metal nitrides by the photolytic/pyrolytic decomposition of metal amides. The metal amides may be zirconium and/or niobium amides, which may additionally contain titanium amides.

8 Claims, 3 Drawing Sheets

METAL-NITRIDES PREPARED BY PHOTOLYTIC/PYROLYTIC DECOMPOSITION OF METAL-AMIDES

FIELD OF THE INVENTION

This invention is directed to a method for preparing metal nitrides which involves the photolytic/pyrolytic decomposition of metal amides. More particularly, the metal nitrides are prepared from amide consisting essentially of zirconium amides and/or niobium amides, which may additionally include titanium amides.

BACKGROUND OF THE INVENTION

Metal nitrides are powders generally prepared from high temperature treatment of a source of metal and a source of nitrogen. Preparation of metal nitride films is usually carried out by chemical vapor deposition methods which require expensive instrumentation. If films are to be localized on the small area of a substrate, the rest of the area needs to be protected which adds to the cost of preparation of localized films. Clearly, new methods need to be developed which are convenient and economically acceptable. It would be desirable if localized coatings of metal nitrides could be produced by a method involving photolytic decomposition which would allow only the desired area of a substrate which has been covered with a metal nitride precursor to be converted to the metal nitride. According to such a process, a substrate could be covered with a metal nitride precursor and then the desired area could be irradiated with a suitable light which would result in the decomposition of the precursor. The undecomposed precursor could subsequently be removed and then the substrate processed further to convert the decomposed precursor to a metal nitride coating.

Narula and Maricq, the present inventors, in an article entitled "1.064 µm Multiphoton Laser-induced Fluorescence and Dissociation of Tetrakis-(dimethylamino) Titanium(IV)", Chemical Physics Letters, Volume 198, number 3, 6, December, 1991, disclose that titanium amide when subjected to a particular laser light decomposes primarily to an insoluble residue metal amide oligomer and dimethylamine. In articles entitled "Laser Induced Decomposition of Precursors Containing M-N Bonds for the Preparation of Metal-Nitride Preceramics, Powders and Coatings", Am. Chem. Soc. Pol. Div. 32,499 (1991), and "Preparation of Composite Particles by Pulsed Nd-TAG Laser Decomposition of $[(CH_3)_2N]_4$ Ti to TiN Coat $Al_2O_3$, $TiO_2$ $O_2$ $Si_3N_4$ Powders" J. Am Ceram. for. (1993) 2727 Narula and Maricq disclose that after subjecting the titanium amide to photolytic decomposition by means of a laser, the resulting material can be pyrolyticly decomposed to form titanium nitride. Both of these article disclose that materials similar to the titanium amide, i.e., boron amide and silicon amide, in contrast, were found unexpectedly to not decompose when exposed to the laser.

BRIEF DESCRIPTION OF THE INVENTION

This invention is directed to a method of preparing a material product comprising metal nitride by photolytic/pyrolytic decomposition of particularly claimed metal amides. The method comprises providing metal amides selected from the group consisting of (a) $Zr[R_2N]_4$; (b) $Nb[R_2N]_4$; (c) mixtures of (a) and (b); and (d) mixtures of any of (a), (b), or (c) with $Ti[R_2N]_4$; wherein R is an organic group; irradiating said metal amides for a time sufficient to decompose at least a portion of said metal amides to an metal-organic residue; removing undecomposed metal amides from said metal-organic residue; and pyrolyzing said metal-organic residue in an inert or an ammonia atmosphere at an elevated temperature to form a material comprising metal nitrides. For example, the residue, if pyrolyzed in an inert atmosphere such as nitrogen, will provide a metal nitride/metal carbide composite or, if pyrolyzed in an ammonia/nitrogen atmosphere, will provide substantially metal nitride.

DETAILED DESCRIPTION OF FURTHER EMBODIMENTS

This invention is directed to a method of preparing metal nitrides by photolytic/pyrolytic decomposition of metal amides as disclosed above. The metal amides are selected from the group consisting of zirconium amide, niobium amide, and mixtures of them; in addition the metal amide may include titanium amide. As characterized by chemical formula, these amides are selected from zirconium $Zr[R_2N]_4$, $Nb[R_2N]_4$, and $Ti[R_2N]_4$. R is an organic group which may be, but is not limited to, methyl, ethyl, n-proryl, i-propyl, n-butyl, sec-butyl, t-butyl, etc. Preferably R is the ethyl group. We found that other similar amides, such as $Y([(CH_3)_3Si]_2N)_3$, in contrast did not provide a nitride when subjected to the photolytic/pyrolytic method of this invention.

Figure 1:
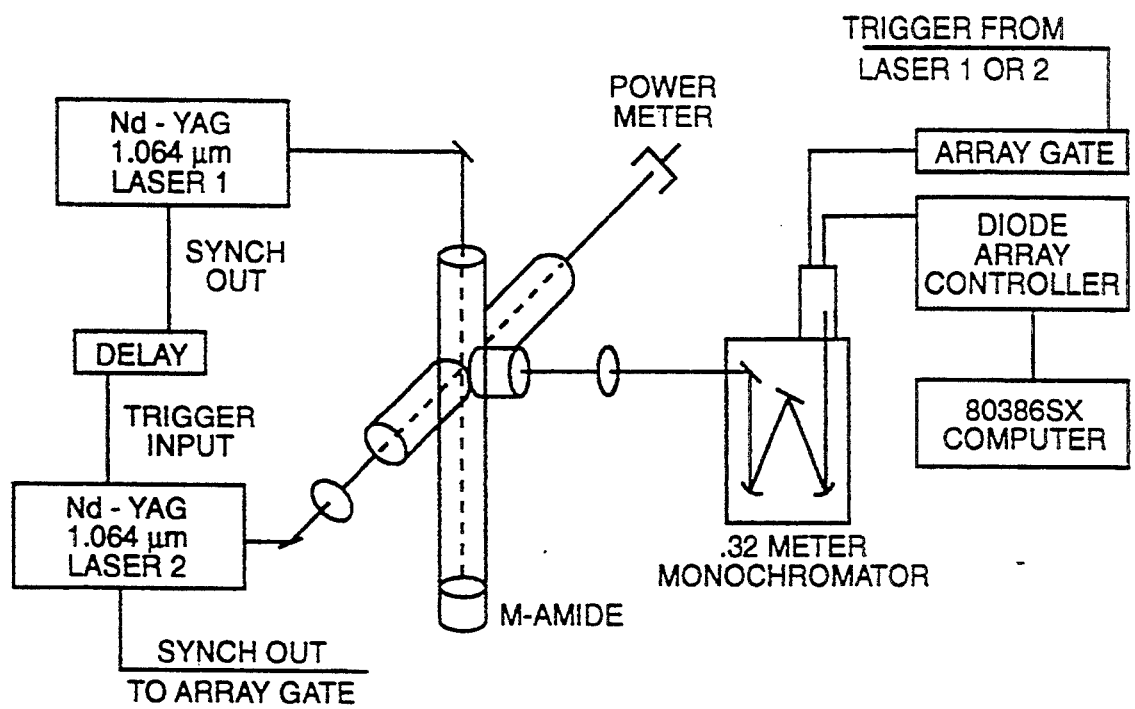
FIG. 1 is a schematic diagram of an apparatus employed for laser assisted decomposition of embodiments of present invention metal amides and their spectroscopic measurements.

The method for preparing the material of the invention comprising metal nitride may be carried out, according to one embodiment, using an apparatus of the type shown in FIG. 1. Using such as apparatus, the tube is charged with metal amide and then partially evacuated. According to this embodiment, the metal amide could be kept in gas or liquid phase or dissolved in an inert organic solvent such as pentane, hexane, heptane etc. Preferably, according to such an enbodiment of making the metal nitride, the solvent is hexane. The amide is then irradiated, in this embodiment, with a laser light, for a time sufficient to decompose at least a portion of the metal amide to form an organo-metallic residue. The irradiation is then stopped and undecomposed metal amide removed from the residue. This can be done, for example, by distillation or by extraction with hexane.

In addition, should it be desired to form a material comprising metal nitride on a particular substrate, the process would be carried out by providing the desired amide (or combination of amides) on the substrate. The substrate may comprise particles of the substrate. Preferably, the substrate would comprise a refractory material such as magnesium oxide, aluminum oxide, silicon nitride, and titanium oxide. Decomposition of the metal amide, in such an instance, could then be carried out as described above. The decomposition of the metal amide may be carried out by irradiation with a laser including but not limited to a 1.064 micrometer frequency ND-YAG laser. Other laser frequencies which may also suitably be used include the 351 nanometer pulses from an excimer laser, 308 nanometer pulses, 248 nanometer pulses and 193 nanometer pulses or other intense visible/UV lasers. We observed that when employing the 1.064 micrometer laser, the radiation initially passed through the metal amide sample with little loss of intensity. Over the course of a few minutes, at a laser intensity of $1.6 \cdot 10^8 Wcm-2$, the initially clear pale yellow zirconium amide $(Zr[(C_2H_5)_2N]_4)$ began to turn brown. The color change was not noticeable in the case of the corresponding niobium amide, due to its initial dark brown color. Concurrently, in the particular example described above, an intense laser-induced fluorescence developed along the entire length of the sample tube.

FIGS. 2A and 2B and 3A and 3B show emission spectra at various laser intensities after the laser decomposition; the spectra of 2A and 3A being generated by an unfocused laser beam and 2B and 3B being generated by a focused laser beam. At lower intensities, broad band emission is observed over the range of 300-650 nanometers; higher intensity irradiation produces structure in the emission spectrum corresponding to known Zr and Nb emission lines. The laser-induced fluorescence spectra shown is the result of multi-photon absorption by zirconium amide $(Zr[(C_2H_5)_2N]_4)$ or niobium amide $(Nb[(C_2H_5)_2N]_4)$ and/or other metal and nitrogen containing molecular fragments which have been decomposed and volatilized by a 1.064 um according to embodiments of the present invention laser. The sharp features show that atomic metal is among the decomposition products. The observation of atomic emission lines from the metal atoms (zirconium or niobium) and the formation of a black coating along the sides of the sample cell imply that not only multi-photon absorption, but also multi-photon dissociation occurred.

The major dissociation products obtained after 1.064 micrometer radiation of zirconium amide and niobium amide are diethylamine, tetraethylhydrazine, and ethylenylene amine, (as revealed by GC-mass spectrometry) and an insoluble, gray-black, residue. The IR spectrum of the residue indicates that it contains organic groups. The residue could be either an oligomer, a polymer, or a mixture of species.

After removal of the undecomposed metal amide from the metal-organic residue, the residue is pyrolyzed in an inert atmosphere (including, but not limited to nitrogen and argon and mixtures thereof) or in an ammonia comprising atmosphere, the latter generally including nitrogen, and at an elevated temperature to form a product comprising metal nitrides. Depending on the pyrolysis conditions, the residue will convert to a product which is (1) a composite of metal nitrides and metal carbides or (2) substantially metal nitrides. That is, at lower pyrolysis temperatures about 600° C., the metal nitrides/metal carbide composite will be obtained while at higher pyrolysis temperatures above about 1000° C., the product is substantially metal nitride in the presence of ammonia. If the nitride/carbide composite is desired, the inert atmosphere employed is preferably nitrogen. On the other hand, when attempting to form substantially metal nitride product, the preferred atmosphere employed is ammonia/nitrogen. If a mixture of amides has been employed in the photolytic/pyrolitic decomposition method of this invention under conditions to form substantially nitrides, the final product will be a composite of the various nitrides such as $TiN/Nb_4N_3$, $ZrN/Nb_4N_3$, and $TiN/ZrN$, with a uniform distribution of components. In addition, as disclosed above, according to the method of the invention metal nitride or metal nitride/metal carbide materials can be deposited on any substrate or substrate particle to result in, e.g., substrate particles having a coating of such materials thereon.

Figure 4:
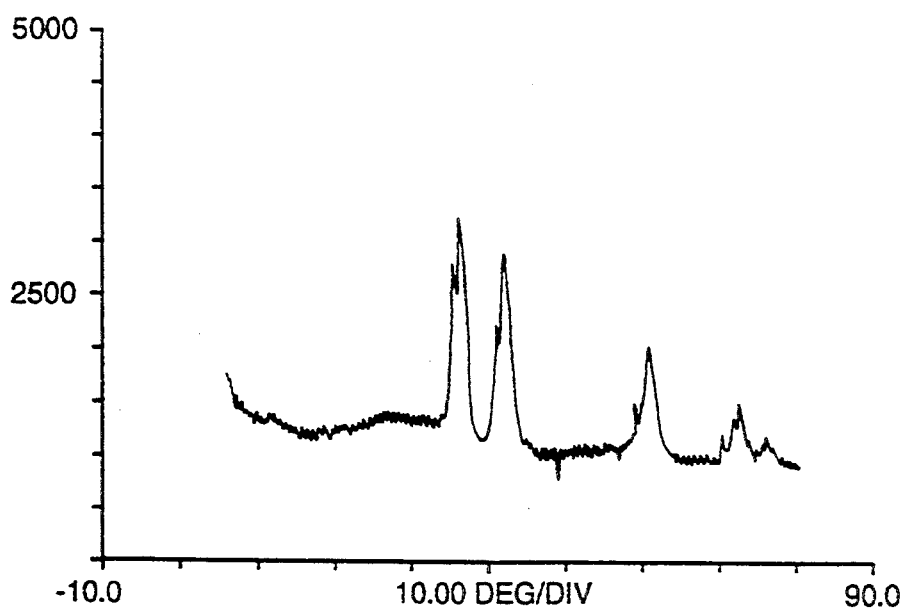
FIG. 4 is a X-Ray powder diffraction study the of pyrolysis product made according to an embodiment of the present invention of residue from the decomposition of $Nb[N(C_2H_5)_2]_4$.
Figure 2A:
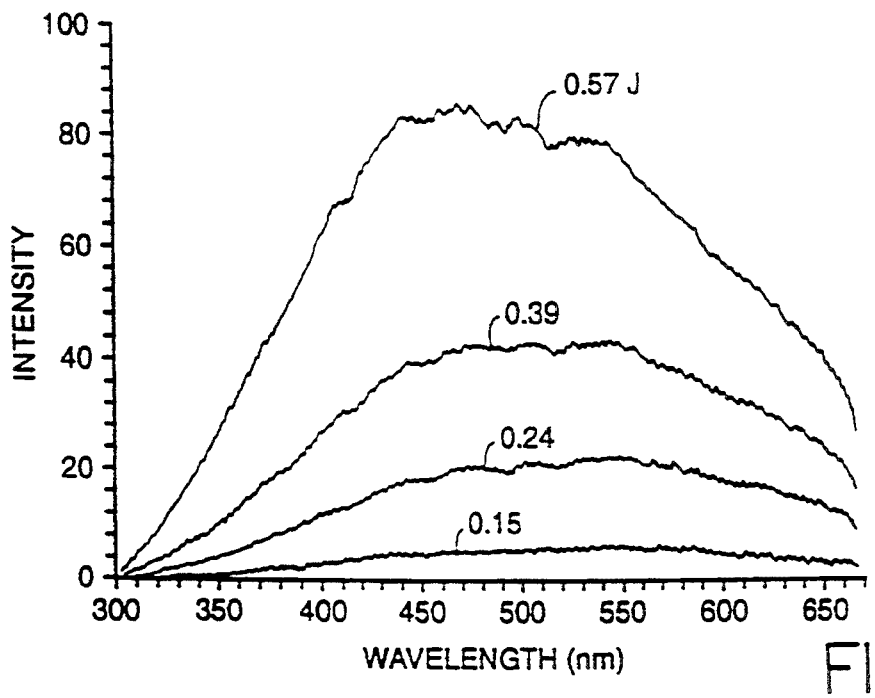
FIGS. 2A and 2B are graphs showing the laser induced fluorescence spectra of $Zr[N(C_2H_5)_2]_4$ and/or its decomposition fragments made according to an embodiment of the present invention, using unfocused and focused laser beams, respectively.
Figure 2B:
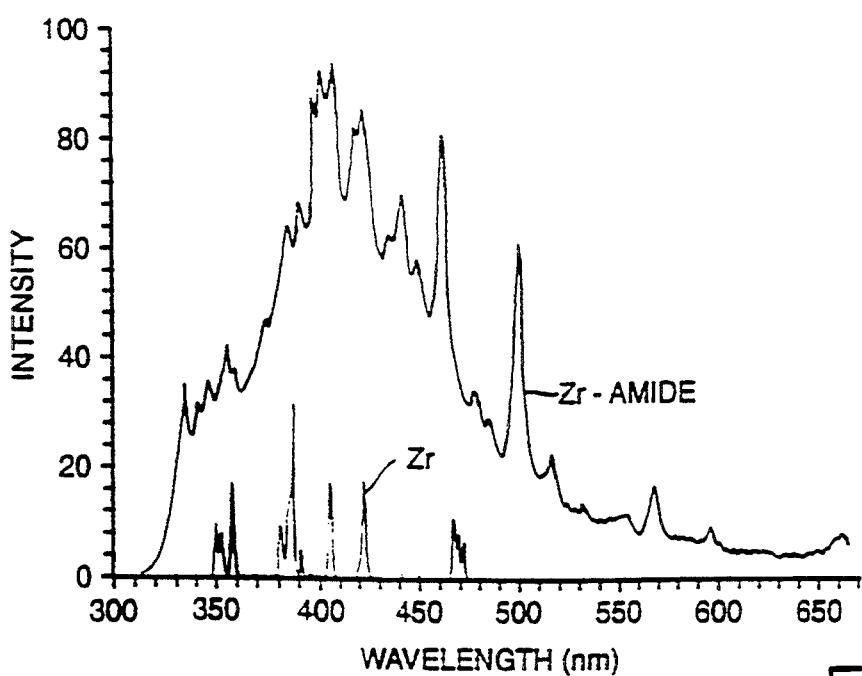
Figure 3A:
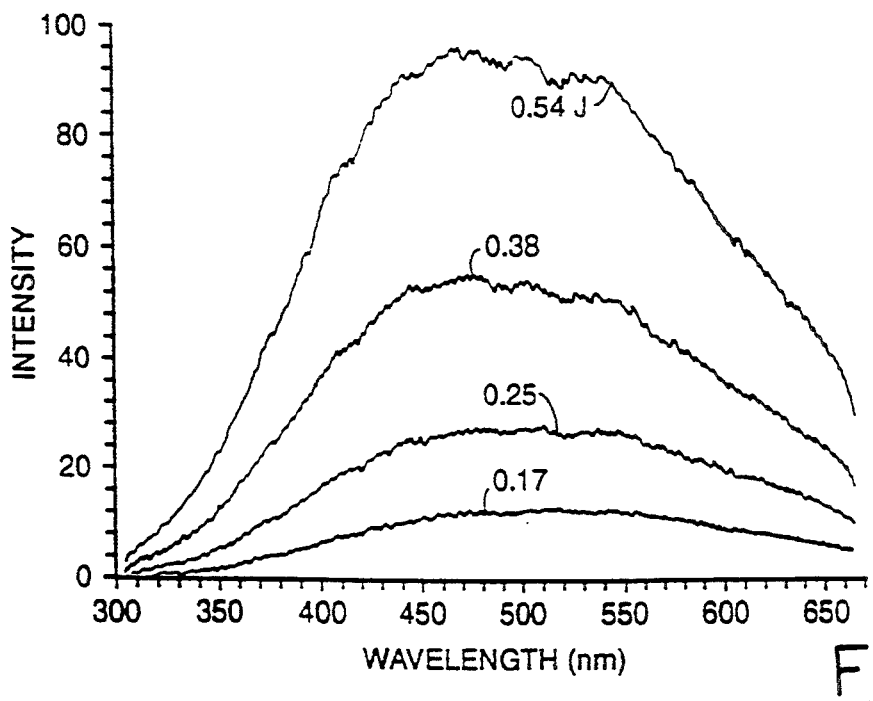
FIGS. 3A and 3B are graphs showing laser induced fluorescence spectra of $Nb[N(C_2H_5)_2]_4$ and/or its decomposition fragments made according to an embodiment of the present invention, using unfocused and focused laser beams, respectively.
Figure 3B:
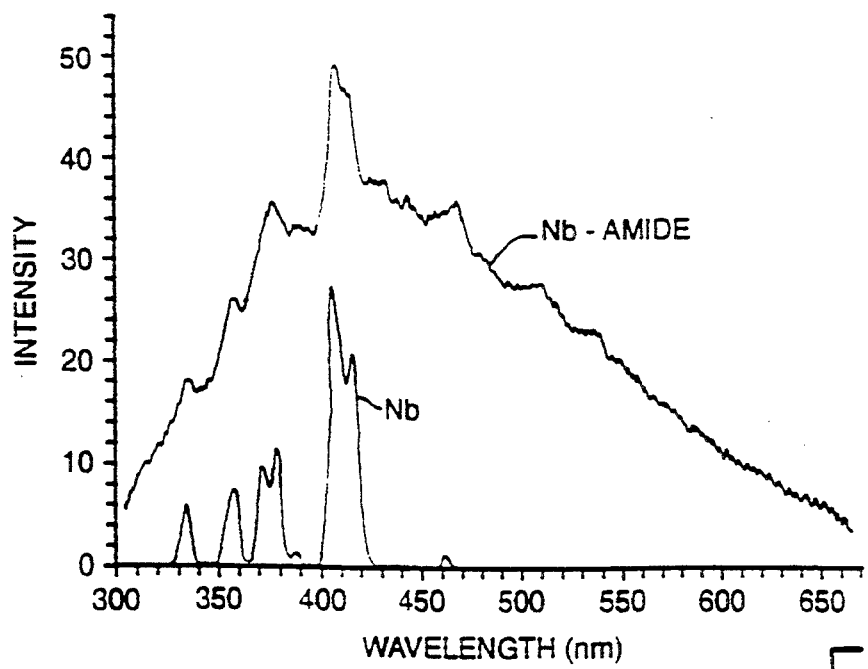

Metal-organic residues of the preferred niobium amide $(Nb[(C_2H_5)_2N]_4)$ and corresponding zirconium amide, when fired at 800° C. in a nitrogen or ammonia atmosphere, yielded powders which were identified by X-ray powered diffraction to be $Nb_4N_3/NbC$ and ZrN, respectively. These powders were converted to pure nitrides by firing in an ammonia atmosphere at 1100° C. for two hours. The yields of ZrN and $Nb_4N_3$ were quantitative based on decomposed zirconium amide $(Zr[(C_2H_5)_2N]_4)$, 40% decomposition, and niobium amide $(Nb[(C_2H_5)_2N]_4$, 70% decomposition. Undecomposed zirconium amide and niobium amide were distilled out of the reaction vessel to obtain an accurate value for decomposed zirconium amide and niobium amide, respectively. As shown in FIG. 4, the position and intensity of diffraction peaks matches with those reported for $Nb_4N_3$. More particularly, the X-ray diffraction pattern of the obtained $Nb_4N_3$ powder showed deffraction peaks at 2Θ(Intensity)=35.6(100), 41.2(100), 41.8(60), 59.6(40), 60.1(60), 71,4(20), 72.5(20), which is in complete agreement with that reported for niobium nitride.

The following examples detail materials comprising metal nitrides made according to the method of the present invention. The method was carried out using the apparatus shown in FIG. 1.

Example 1

Precautions were taken to exclude air and moisture from the apparatus. Amides comprising, $Zr[N(C_2H_5)_2]_4$, and $Nb[N(C_2H_5)_2]_4$ were prepared according to D. C. Bradley, I. M. Thomas, "Metallo-Organic Compounds Containing Metal-Nitrogen Bonds. Part I. Some Dialkylamino-Derivatives of Titanium and Zirconium." J. Chem Soc., 3857 (1960). The amides were charged in the quartz tube and irradiated by an unfocused (beam diameter-7 mm) 1.064 μm output of a Nd:YAG laser operating at 10 Hz with an energy output of approximately 600 mJ/pulse and a pulse width of 9 ns. Over the course of several minutes, the metal amide samples turned opaque black. The irradiation was stopped and excess amides and volatile decomposition products were distilled out of the reaction vessel under vacuum. The remaining dark grey-black free-flowing powders were fired in a flow of ammonia at 1100° C.

Example 2

The quartz tube was charged with $Zr[N(C_2H_5)_2]_4$ [0.948 g] and connected to a vacuum system. After evacuation, the tube was filled back with sufficient nitrogen to keep the sample at 50 torr. The sample was irradiated with 1.064 μm light from a Nd-YAG laser. Excess $Zr[N(C_2H_5)]_4$ (0.77 g) was recovered by distillation and the residue was pyrolyzed at 1100° C. under an ammonia atmosphere for 60 minutes. The product was ZrN in a yield of 90%.

Example 3

The preparation of niobium nitride powders was carried out from $Nb[N(C_2H_5)_2]_4$. In a quart tube, 1.04 g of $Nb[N(C_2H_5)_2]_4$ was placed and exposed to 1.064 μm laser radiation. Undecomposed $Nb[N(C_2H_5)_2]_4$ (0.29 g) was distilled out and the residue was pyrolyzed at 1100° C. in an ammonia atmosphere to form $Nb_4N_3$. The yield of $Nb_4N_3$ 85%.

Example 4

A mixture of $Nb[N(C_2H_5)_2]_4$, $Zr[N(C_2H_5)_2]_4$, and/or $Ti[N(C_3)_2]_4$ is placed in a quartz tube and irradiated with 1.064 μm laser light. Undecomposed metal amides are removed by distillation and residue is fired in an ammonia atmosphere at 1100° C. to obtain composites. Firing in the nitrogen atmosphere at this temperature results in composites containing metal carbide also.

We claim:

1. A method of preparing materials comprising metal nitrides by photolytic/pyrolytic decomposition of metal amides, which method comprises:
   providing metal amides selected from the group consisting of (a) $Zr[R_2N]_4$; (b) $Nb[R_2N]_4$; (c) mixtures of (a) and (b); and (d) mixtures of any of (a), (b), or (c) with $Ti[R_2N]_4$; wherein R is an organic group;
   irradiating said metal amides to decompose at least a portion of said metal amides to an metal-organic residue;
   removing undecomposed metal amides from said metal-organic residue; and
   pyrolyzing said metal-organic residue in an inert or ammonia atmosphere at an elevated temperature to form a material comprising metal nitrides selected from the group consisting of (a) ZrN; (b) $Nb_4N_3$; (c) mixtures of (a) and (b); and (d) mixtures of any of (a), (b), or (c) with TiN.

2. The method according to claim 1, wherein said metal amides are provided deposited on a substrate comprising refractory material.

3. The method according to claim 2, wherein said substrate is in particulate form.

4. The method according to claim 2, wherein said refractory material is selected from the group consisting of magnesium oxide, aluminum oxide, silicon nitride, and titanium oxide.

5. The method according to claim 1, wherein during said irradiating step said metal amides are provided in a gas phase, liquid phase, or dissolved in an inert organic solvent.

6. The method according to claim 1, wherein said atmosphere comprises gases selected from the group consisting of nitrogen, argon, ammonia and mixtures thereof.

7. The method according to claim 6, wherein said inert atmosphere comprises nitrogen and said pyrolyzing temperature is about 600° C.

8. The method according to claim 6, wherein said atmosphere comprises an ammonia and said pyrolyzing temperature is above 1000° C.

* * * * *